United States Patent [19]
Jedlitschka et al.

[11] Patent Number: 6,115,236
[45] Date of Patent: Sep. 5, 2000

[54] MODULAR SUPPORT FOR THE FUNCTIONAL ELEMENTS OF A HIGH-VOLTAGE POWER SUPPLY UNIT

[75] Inventors: Hans Jedlitschka, Chatillon; Denis Perillat, Paris; Jacques Sireul, Wissous, all of France

[73] Assignee: GE Medical Systems S.A., France

[21] Appl. No.: 09/168,843

[22] Filed: Oct. 8, 1998

[30] Foreign Application Priority Data

Oct. 9, 1997 [FR] France .................................. 97 12607

[51] Int. Cl.⁷ ...................................................... H02B 1/00
[52] U.S. Cl. ........................ 361/600; 361/728; 361/729; 361/807; 361/809; 361/815; 361/836; 174/50; 174/50.51; 174/50.54; 336/90; 336/92; 307/150
[58] Field of Search ...................................... 361/600, 603, 361/658, 704, 690, 719, 720, 728, 730, 809, 810, 817, 818; 174/50, 50.5, 50.51–50.54, 51; 336/90–98; 307/150

[56] References Cited

U.S. PATENT DOCUMENTS

| | | | |
|---|---|---|---|
| 4,639,834 | 1/1987 | Mayer | 361/710 |
| 5,077,771 | 12/1991 | Skillicorn et al. | 378/102 |
| 5,185,691 | 2/1993 | Korinsky | 361/720 |
| 5,416,837 | 5/1995 | Cote et al. | 379/399 |
| 5,481,438 | 1/1996 | Nemoto | 361/810 |
| 5,703,325 | 12/1997 | Yamaguchi et al. | 174/50 |

FOREIGN PATENT DOCUMENTS

| | | |
|---|---|---|
| 0429315 | 5/1991 | European Pat. Off. . |
| 0430755 | 6/1991 | European Pat. Off. . |
| 3833129 | 4/1989 | Germany . |
| 4142371 | 6/1993 | Germany . |
| 4209202 | 9/1993 | Germany . |

*Primary Examiner*—Leo P. Picard
*Assistant Examiner*—Boris H. Chervinsky
*Attorney, Agent, or Firm*—Jay L. Chaskin

[57] ABSTRACT

The HT power supply unit modular support according to the invention comprises functional housings intended to accommodate the functional elements of the power supply unit, the insulating walls of which are formed by two protruding walls (2, 3) having overlapping complementary inclined surfaces (5, 6). Application to HT power supply units for X-ray sources.

15 Claims, 3 Drawing Sheets

MODULAR SUPPORT FOR THE FUNCTIONAL ELEMENTS OF A HIGH-VOLTAGE POWER SUPPLY UNIT

BACKGROUND OF THE INVENTION

The present invention relates to a high-voltage (HT) power supply unit, particularly for an X-ray tube in which unit all of the high-voltage power supply functional components are contained in a single box.

X-ray tubes comprise a cathode of the filament type which emits a beam of electrons towards an anode. The anode, under the action of the beam of electrons, emits a beam of X-rays. To obtain a high-energy beam of electrons, the beam of electrons emitted by the cathode is accelerated by a strong electric field created between the cathode and the anode. To achieve this, the anode is raised to a positive potential with respect to the cathode, the potential difference between the anode and the cathode generally reaching values of 150 kV or more. These extremely high potential differences are provided by high-voltage devices.

The functional elements of these high-voltage devices are encased in an earthed metal box filled with an electrically insulating and cooling liquid.

The functional elements conventionally comprise a high-ratio HT transformer comprising primary and secondary windings, a magnetic core, HT rectifiers and HT smoothing capacitors.

More specifically, the transformer has primary windings to which AC voltages supplied by a power converter are applied, and secondary windings connected to voltage doubling rectifier circuits. The voltage doubling/rectifier circuits of each of the secondary windings are connected together so that their voltages are combined. By respecting the polarity of the rectifiers, positive or negative voltages can be added to obtain the high voltage level needed to power the X-ray tube.

The high-voltage output within the HT unit is protected by resistors connected through the HT box cover plate to hermetically sealed HT connectors, receptacles accommodating the connector pins of the HT lead connecting the HT device to the X-ray tube. The HT outputs are also connected, within the HT unit, to voltage-dividing resistors which form the upper part of a voltage divider supplying a low voltage which is proportional to the level of the output high voltage.

Also to be found within the box are the conductors needed for providing the electrical connections between the functional elements and for electrically connecting the HT power supply device to the X-ray tube.

All the functional elements need to be supported within the box and electrically insulated from one another.

BRIEF SUMMARY OF THE INVENTION

The subject of the present invention is therefore a support for the functional elements of an HT unit which both provides support for the functional elements and electrically insulates them and which contains the minimum number of parts, is easy to manufacture, and of a low cost.

More specifically, the present invention relates to a modular support for a high-voltage power supply unit in which all of the functional components of the high-voltage power supply are supported by the modular support which is made of an electrically insulating material, the modular support together with the functional components being arranged in a single earthed metal box filled with an electrically insulating fluid that encourages heat conduction.

Another subject of the present invention is a support for the functional elements of an HT unit as described earlier, in which there are grouped all the components of an HT transformer, the boards of the voltage doubling/rectifier circuits, the boxes of resistors of the voltage divider and output-protection resistors.

A further subject of the present invention is a support as defined earlier, which also incorporates an HT output unit that groups together the HT output receptacles, the filament transformers and, in some cases, the HT output commutator.

The above objectives are achieved by providing a modular support for an HT power supply unit comprising housings with electrically insulating walls and intended to accommodate functional elements of the HT power supply unit, wherein the electrically insulating walls of the housings are formed of two protruding walls which have overlapping complementary inclined surfaces.

In one embodiment of the invention, the modular support for an HT power supply unit, particularly for powering an X-ray tube, comprises:

a central module formed of two parts with identical configurations and comprising a base and walls protruding from the base, these two parts being joined together by their bases symmetrically with respect to a central vertical axis of the central module; and a first end module and a second end module with identical configurations each comprising a base and walls protruding from the base, the said protruding walls of the central module and of the first and second modules having inclined complementary surfaces so that when each of the first and second end modules on assembled with one of the parts of the central module, the protruding walls of the corresponding housings of the modules fit closely together by the overlapping of the complementary inclined surfaces to form housings intended to accommodate functional elements of the HT power supply unit. This thus provides a support and appropriate electrical insulation for the functional elements of the HT power supply unit which are arranged in the housings.

In general, the modular support defines housings for a magnetic core for the primary and secondary windings of an HT transformer, housings for the voltage doubling/rectifier circuits and housings for the resistors of a voltage divider.

Quite obviously, the modules of the modular support have the passages needed for electrically connecting the various functional elements.

In another embodiment of the invention, the modular support comprises a fourth module comprising a first part and a second part of complementary configurations each comprising a base and walls protruding from the base and defining housings for functional elements of an HT output unit, the first part of this fourth module being joined by its base to a lateral wall of the central module, and when the first and second parts of this fourth module are joined together, the corresponding protruding walls of the parts of the fourth module overlap and electrically insulate the functional elements from the output unit.

In general, this fourth module comprises housings for the HT output receptacles and housings for the transformers of the filament for powering the cathode.

Because of the overlap of the corresponding protruding walls that define the housings, the length of the creepage lines is increased and therefore the insulation of the housings is increased and the risk of arcing is decreased.

As mentioned earlier, the protruding walls of the modules have inclined complementary overlapping surfaces, that is to say that the thickness of these walls decrease uniformly from the base of the module or from the module part as far as their free end. This then makes it easier for the modules and module parts to fit together and for them to be manufactured by molding, particularly facilitating mold release. More important still, the presence of these complementary inclined surfaces ensure a fit that from both the electrical point of view and the mechanical point of view is adequate irrespective of the manufacturing tolerances (diameter and height) of the protruding walls.

Furthermore, as the final insulating wall of the housings consists of two separate walls which overlap, the reliability of the electrical insulation is increased even if there should be a region in one of the protruding walls which is non-uniform from the dielectric point of view, because the probability of two non-uniform regions on each of the overlapping walls finding themselves facing one another is practically non-existent.

As a preference, the modules and module parts are molded from a plastic.

DETAILED DESCRIPTION OF THE INVENTION

Figure 1:
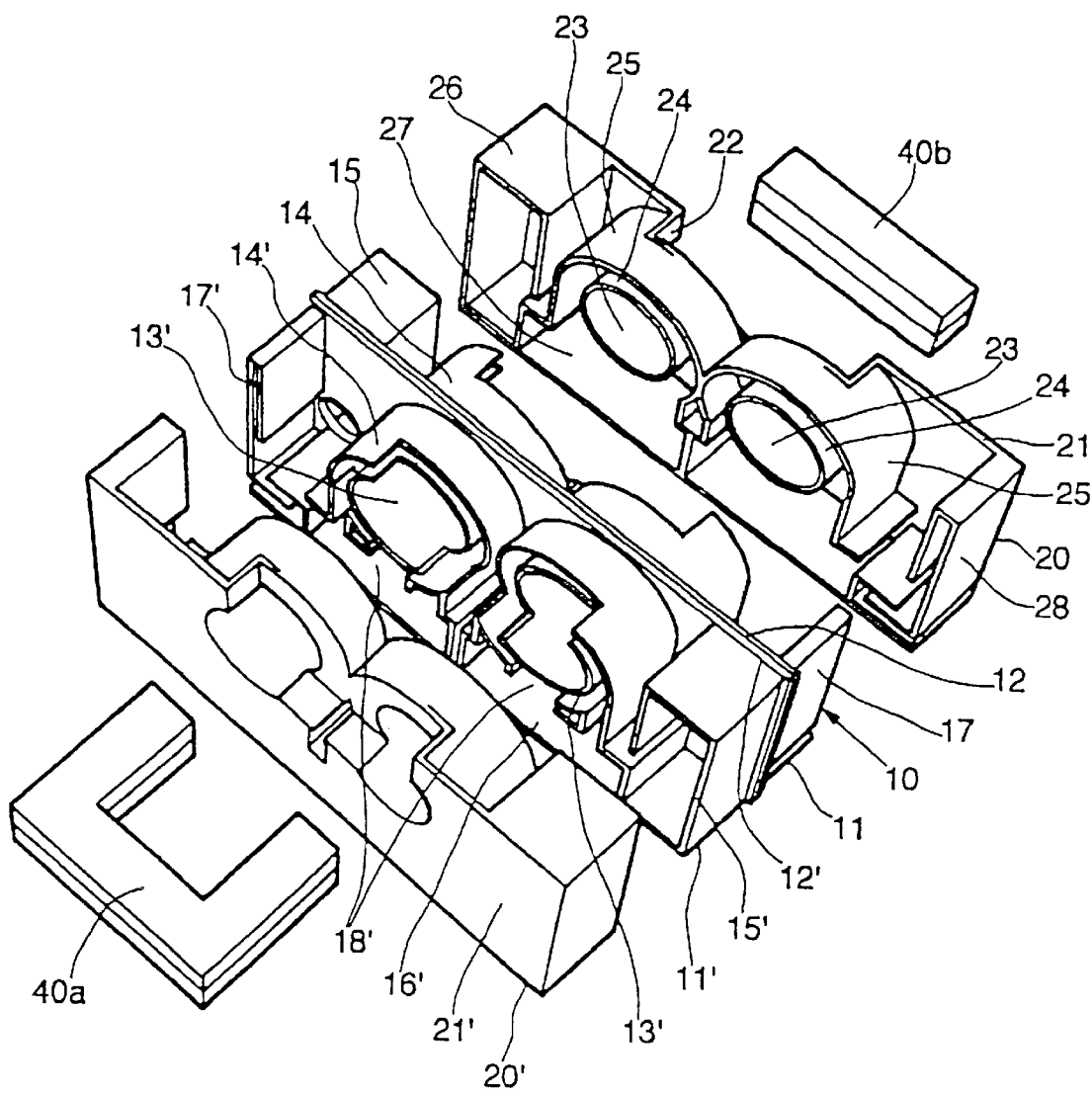
FIG. 1, an exploded perspective view of one embodiment of a modular support.

Referring to FIG. 1, an example of a modular support according to the invention has been depicted and comprises a central module 10 of parallelepipedal overall shape and two end modules 20, 20' of parallelepipedal overall shape.

The central module 10 is made up of two parts 11, 11' of molded plastic, of parallelepipedal overall shape and with identical configurations.

Each of the parts 11, 11' of the central module 10 comprises a flat base 12, 12' of rectangular overall shape comprising two circular openings intended, as will be seen later, to allow the legs of a magnetic core 40a, 40b to pass.

Cylindrical walls, of which only the cylindrical walls 13' of the part 11' of the central module 10 are visible in FIG. 1 protrude from the bases 12, 12' and each surround circular openings. The cylindrical walls in part define a housing for the magnetic core 40a, 40b and the primary windings (not depicted) of an HT transformer.

A semi-cylindrical wall 14, 14' protrudes from the bases 12, 12' and surrounds each of the cylindrical walls thus forming between them, in part, housings intended to accommodate the secondary windings (not depicted) of the HT transformer.

Each of the parts 11, 11' of the central module 10 also comprises, at one of their transverse ends, walls which protrude from the base 12, 12' and partly define a housing of parallelepipedal overall shape 15, 15' intended to accommodate the voltage doubling/rectifier circuits.

Each part 11, 11' comprises a rectangular end wall 16' (only one of these being visible in FIG. 1) and a rectangular lateral wall 17, 17' at the opposite transverse end to the housings 15, 15'. The end walls of the parts 11, 11' of the central module and the lower ends of the semi-cylindrical walls 14, 14' are spaced apart so that they in part form housings 18' (visible only on the part 11') for accommodating voltage doubling/rectifier circuits.

The parts 11, 11' of the central module are joined together back to back by their bases 11, 11' and symmetrically with respect to a central vertical axis of the central module 10.

The end modules 20, 20' will now be described. Given that these modules have identical configurations, a description will be given of just one of these modules, it being understood that this description applies in full to the other module.

As can be seen in FIG. 1, the module 20 has a parallelepipedal overall shape and a configuration that complements that of the part 12 of the central module 10.

More specifically, the end module 20 comprises a base 21 of rectangular overall shape comprising a recessed part 22 for accommodating a transverse leg 40b of the magnetic core.

Two symmetric circular openings 23 are formed in the base 21 at the recessed part 22.

Each of the circular openings 23 is surrounded by a cylindrical wall 24 protruding from the base and complementing the cylindrical walls of the part 11 of the central module 10 and which partially define a housing for the magnetic core 40a, 40b. Likewise, each of the cylindrical walls 24 is surrounded by a semi-cylindrical wall 25 protruding from the base 21, complementing the semi-cylindrical walls 14 of the central module 10 and, with the cylindrical protruding wall 24, defining an annular housing for a secondary winding of the HT transformer.

The end module 20 also has at one of its transverse ends, walls which protrude from the base 21 and in part define a housing of parallelepipedal overall shape 26 intended to accommodate voltage-doubling/rectifier circuits.

The end module 20 further comprises an end wall 27 of rectangular overall shape and a U-shaped lateral wall 28 at the opposite transverse end to the parallelepipedal housing 26.

As is shown in FIG. 1, the end modules 20, 20' are sized so that they fit over the corresponding parts 11, 11' of the central module 10. In particular, the protruding walls of the end modules 20, 20', when the modules are joined together, externally overlap the corresponding protruding walls of the central module 10.

Quite obviously, the reverse could also be produced. If necessary, the modules could be fixed together by screws, for example screws made of plastic.

As mentioned earlier, the corresponding protruding walls have inclined complementary surfaces which allow these walls to fit together closely by overlapping to form the corresponding housings for the functional elements.

Figure 2:
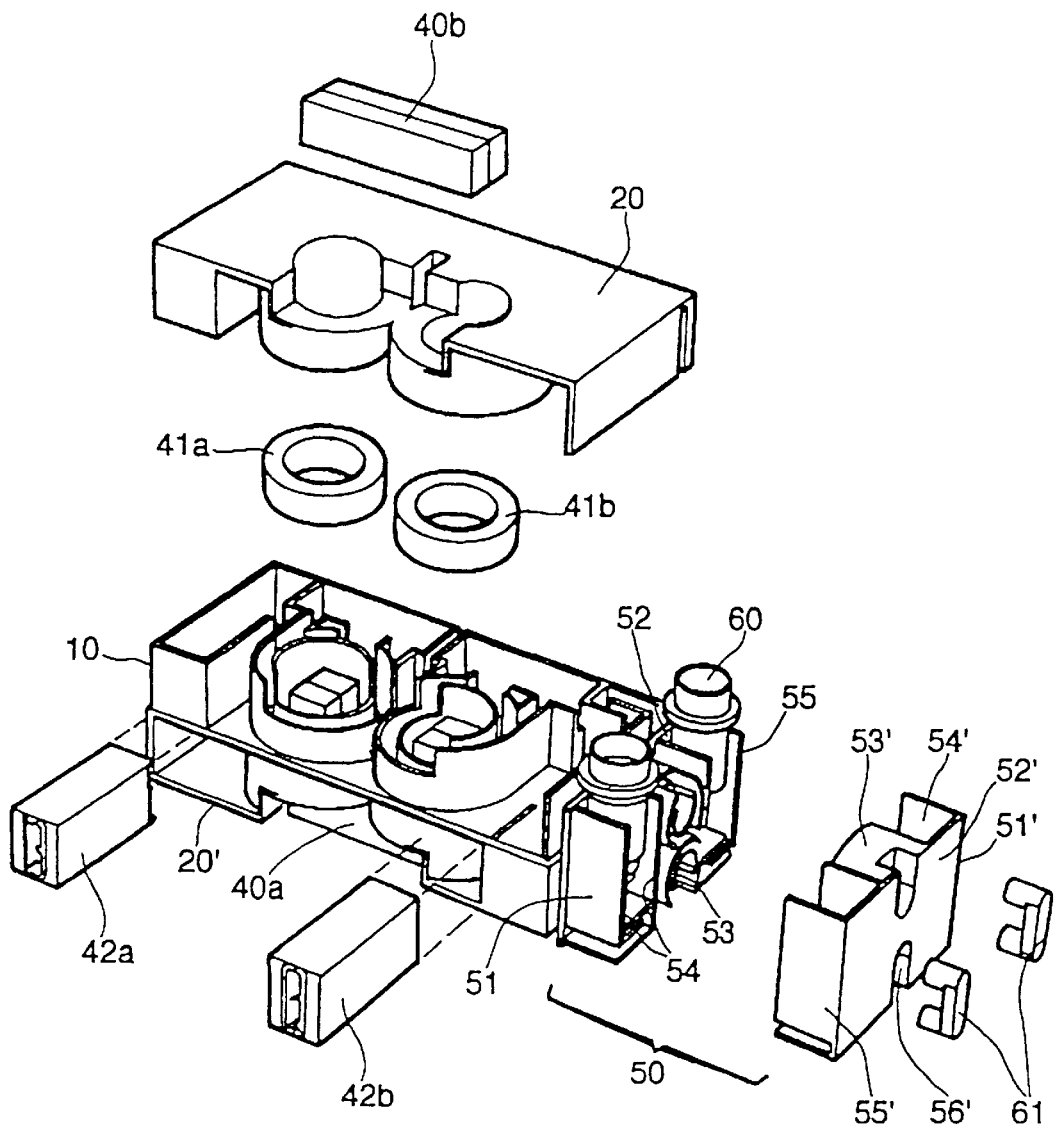
FIG. 2, an exploded perspective view of another embodiment of a modular support.

FIG. 2 depicts another embodiment of a modular support according to the invention, which differs from the modular support of FIG. 1 merely in the addition of an additional fourth module 50, for accommodating the HT output functional elements of an HT power supply unit.

As can be seen in FIG. 2, one of the end modules 20' fits onto part of the central module 10 with part 40a of the magnetic core arranged in its housing. This FIG. 2 also depicts the secondary windings 41a, 41b of the HT transformer and the voltage-doubling/rectifier circuits 42a, 42b facing their respective housings.

The fourth module 50 in the embodiment of FIG. 2 comprises a first part 51 and a second part 51. The first part, of parallelepipedal overall shape, comprises a rectangular base 52, two semi-circular walls 53 protruding from the base 52 and partially defining housings for accommodating transformers for the filament and walls 54, 55 partially defining housings of parallelepipedal overall shape one on each side of the semi-circular walls 53 and intended to accommodate HT outlet receptacles 60.

The second part 51', of parallelepipedal overall shape, comprises a rectangular base 52' provided with two cavities 56' that correspond to the two housings for transformers for the filament.

Semi-circular walls 53' protrude from the base 52' in line with the cavities 56'. Walls 54', 55' protruding from the base 52' in register with the walls 54, 55 of the first part 51 of the fourth module 50 also partially define the parallelepipedal housings one on either side of the cavities 56'.

The cavities 56' are intended to allow stirrup-shaped magnetic cores 61 to be inserted.

The two parts 51, 51' of the fourth module are fitted together as described for the modules of the embodiment in FIG. 1, and the fourth module 50 is connected to the other modules along an appropriate side by any appropriate means, for example fitting, bonding or screwing.

The parts of this fourth module are preferably made of molded plastic.

Figure 3:
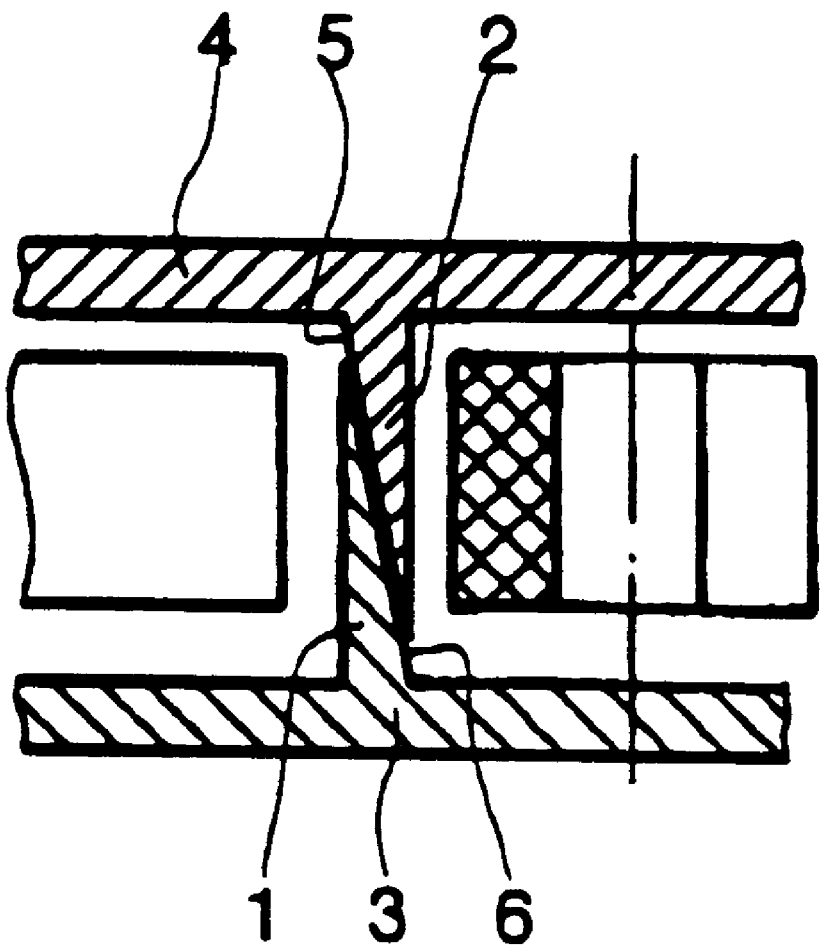
FIG. 3, a diagrammatic view of protruding walls for the modular supports.

FIG. 3 diagrammatically depicts the configuration of the protruding walls defining the housings for the functional elements according to the invention.

As this FIG. 3 shows, the protruding walls 1, 2 are of tapering shape, with a thickness that decreases from the bases 3, 4 from which they protrude, as far as their free ends. As can be seen in FIG. 3, the complementary protruding walls 1, 2 have complementary inclined surfaces, 5, 6 intended to overlap when the modules are fitted together. This configuration of the protruding walls 1, 2 not only encourage their overlapping and fitting and makes the molding operations, particularly mold release, easier, but also improves the electrical insulation between the housings by increasing the length of the creepage lines, thus reducing the risk of arcing.

Furthermore, as mentioned earlier, this configuration of the protruding walls makes it possible to obtain the desired amount of insulation irrespective of the manufacturing tolerances on the modules.

The modules also comprise the passages and cutouts needed for accommodating all the interconnecting connectors, thus avoiding the concentration of strong electric fields and therefore the risks of arc discharges while reducing manufacturing costs.

Although bi-polar units have been depicted in the embodiments, the invention is also applicable to mono-pole or multi-pole units.

Various modifications in structure and/or function and/or steps may be made by one skilled in the art to the disclosed embodiments without departing from the scope and extent of the invention.

What is claimed is:

1. Modular support comprising a housing formed by:
  a central module formed of two parts with identical configurations comprising a first base and first walls protruding from the first base, the two parts being joined together by their respective first bases symmetrically with respect to a central vertical axis of the central module, and
  a first end module and a second end module with identical configurations each comprising a second base and second walls protruding from the second base, the protruding first and second walls of the central module and of the first end and second end modules having overlapping complementary contacting inclined surfaces, so that when each of the end modules is assembled with a corresponding one of the parts of the central module, the protruding first and second walls of the corresponding housings of the modules fit together by the overlapping of the complimentary inclined surfaces.

2. Modular support according to claim 1 wherein the central, first and second end modules comprise a housing for a magnetic core, housings for primary and secondary coils of a transformer and housings for voltage doubling/rectifier circuits.

3. Modular support according to claim 1 comprising an additional module which can be combined with the central, first end and second end modules and comprises a first part having a third base and third walls protruding from the third base and a second part comprising a fourth base and fourth walls protruding from the fourth base defining the protruding walls of the first and second parts of the additional module having complementary inclined surfaces so that when the first and second parts are assembled, the protruding walls fit closely together by overlapping of the complementary inclined surfaces to form housings intended to accommodate functional elements of an output device of the power supply unit.

4. Modular support according to claim 2 comprising an additional module which can be combined with the central, first end and second end modules and comprises a first part having a third base and third walls protruding from the third base and a second part comprising a fourth base and fourth walls protruding from the fourth base defining the protruding walls of the first and second parts of the additional module having complementary inclined surfaces so that when the first and second parts are assembled, the protruding walls fit closely together by overlapping of the complementary inclined surfaces to form housings intended to accommodate functional elements of an output device of the power supply unit.

5. Modular support according to claim 3 wherein the additional module comprises additional protruding walls having additional inclined surfaces defining housings for filament transformers and for output receptacles.

6. Modular support according to claim 4 wherein the additional module comprises additional protruding walls having additional inclined surfaces defining housings for filament transformers and for output receptacles.

7. Modular support according to claim 1 wherein the modules are made of molded plastic.

8. Modular support according to claim 2 wherein the modules are made of molded plastic.

9. Modular support according to claim 3 wherein the modules are made of molded plastic.

10. Modular support according to claim 4 wherein the modules are made of molded plastic.

11. The support of claim 1 wherein each tapered surface extends for the entire length of the wall.

12. The support of claim 1 wherein each protruding wall has two opposing surfaces, one of the two surfaces being inclined with respect to the other surface.

13. Modular support according to claim 1 wherein the walls are electrically insulating.

14. Modular support according to claim 1 wherein the housing accomodates functional elements of a power supply.

15. Modular support according to claim 1 wherein the housings are for a magnetic core, a transformer, and a voltage circuit.

* * * * *